(12) United States Patent
Elliott

(10) Patent No.: US 9,372,204 B2
(45) Date of Patent: Jun. 21, 2016

(54) SENSOR ASSEMBLIES

(75) Inventor: Howard Elliott, Oxfordshire (GB)

(73) Assignee: Future Technology (Sensors) Ltd, Oxfordshire (GB)

(*) Notice: Subject to any disclaimer, the term of this patent is extended or adjusted under 35 U.S.C. 154(b) by 505 days.

(21) Appl. No.: 13/878,042

(22) PCT Filed: Jul. 25, 2011

(86) PCT No.: PCT/GB2011/001103
§ 371 (c)(1),
(2), (4) Date: May 29, 2013

(87) PCT Pub. No.: WO2012/049443
PCT Pub. Date: Apr. 19, 2012

(65) Prior Publication Data
US 2013/0321002 A1 Dec. 5, 2013

(30) Foreign Application Priority Data

Oct. 12, 2010 (EP) .................................... 10013529

(51) Int. Cl.
*G01R 1/04* (2006.01)
*G01D 11/24* (2006.01)
*G01R 3/00* (2006.01)

(52) U.S. Cl.
CPC ................ *G01R 1/04* (2013.01); *G01D 11/245* (2013.01); *G01R 3/00* (2013.01)

(58) Field of Classification Search
CPC ........ G01R 1/04; G01R 3/00; G01R 27/2605; G01D 11/245; G01D 5/2417; G01D 5/2415; G01B 7/14; G01B 7/023; G02F 1/153; G02F 2001/1536; G02F 1/155; B60R 2001/1223; H01G 4/30; H01G 4/232; H01G 4/12; H01G 4/008; H01G 4/224; H01G 4/228; H01G 4/252; H01G 4/2325; H01L 23/49894; H01L 41/0471; H01L 41/293; H04N 5/2252; G01F 1/667; G06F 3/044; H01M 2/021; H01M 2/0287; H01M 2/08

USPC ............ 324/658, 662; 29/25.03, 825; 156/60, 156/154; 361/321.1; 348/E5.026; 73/724, 73/431

See application file for complete search history.

(56) References Cited

U.S. PATENT DOCUMENTS 4,804,905 A * 2/1989 Ding et al. ..................... 324/662
5,302,894 A * 4/1994 Hrubes ..................... 324/207.16

(Continued)

FOREIGN PATENT DOCUMENTS

CN 1672024 A 9/2005
CN 100374814 C 3/2008

(Continued)

OTHER PUBLICATIONS

Material Expansion coefficient, Agilent Technology, 2002, p. 17-2 to 17-12.*

(Continued)

*Primary Examiner* — Melissa Koval
*Assistant Examiner* — Nasima Monsur
(74) *Attorney, Agent, or Firm* — Kilyk & Bowersox, P.L.L.C.

(57) ABSTRACT

The present invention provides a sensor body (1') that can be used as part of a sensor assembly, optionally a capacitive sensor that is used to measure the clearance between the tip of a gas turbine engine blade and the surrounding casing. The sensor body includes a core layer (2) having an electrically conductive electrode layer (6). An outer insulating layer (4) substantially surrounds the core layer (2) and extends along a front part (8) of the sensor body to define a window layer (10) that provides a hermetic seal that excludes gas from any interface between the constituent layers of the sensor body. The core layer (2) and the outer insulating layer (4) are formed from the same electrically non-conducting ceramic material to avoid any problems with differential thermal expansion. The electrode layer (6) is embedded within a front part of the sensor body and extends between the core layer (2) and the window layer (10).

18 Claims, 7 Drawing Sheets

(56) References Cited

U.S. PATENT DOCUMENTS

| | | | |
|---|---|---|---|
| 5,400,659 A | 3/1995 | Yokoi et al. | |
| 5,760,593 A * | 6/1998 | Lawrence et al. | 324/662 |
| 6,374,680 B1 * | 4/2002 | Drewes | G01L 9/0075 73/718 |
| 7,414,415 B2 | 8/2008 | Elliott | |
| 2003/0233883 A1 | 12/2003 | Mei | |
| 2005/0103113 A1 * | 5/2005 | Ernsberger et al. | 73/753 |
| 2007/0108050 A1 | 5/2007 | Elliott | |
| 2009/0015271 A1 | 1/2009 | Elliott | |
| 2011/0006791 A1 | 1/2011 | Schneider et al. | |
| 2011/0090420 A1 * | 4/2011 | Kim | G06F 3/0412 349/59 |

FOREIGN PATENT DOCUMENTS

| | | |
|---|---|---|
| DE | 3313826 A1 | 11/1983 |
| DE | 10 2008 006 833 A1 | 8/2009 |
| EP | 0 695 036 A1 | 1/1996 |
| EP | 2 330 408 A1 | 6/2011 |
| FR | 2 721 105 A1 | 12/1995 |
| GB | 2 423 957 A | 9/2006 |
| JP | 5215582 | 8/1993 |
| JP | 2007506958 | 3/2007 |
| WO | 9740340 A1 | 10/1997 |
| WO | 2007047571 A2 | 4/2007 |
| WO | 2011061471 A2 | 5/2011 |

OTHER PUBLICATIONS

International Search Report for PCT/GB2011/001103 dated Apr. 24, 2012 (6 pages).

Search Report dated Dec. 11, 2014, from the State Intellectual Property Office of the P.R.C, for Chinese Application No. CN 2011800494650; 2 pages.

Notification of Reason(s) for Refusal for Application No. JP 2013-533266 published by the JPO, dated Nov. 12, 2015, with English-Translation.

* cited by examiner

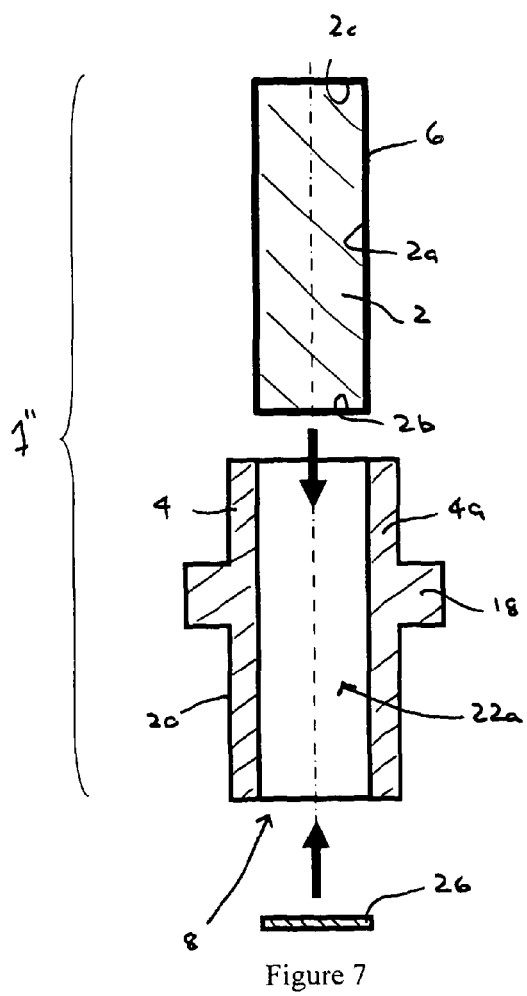
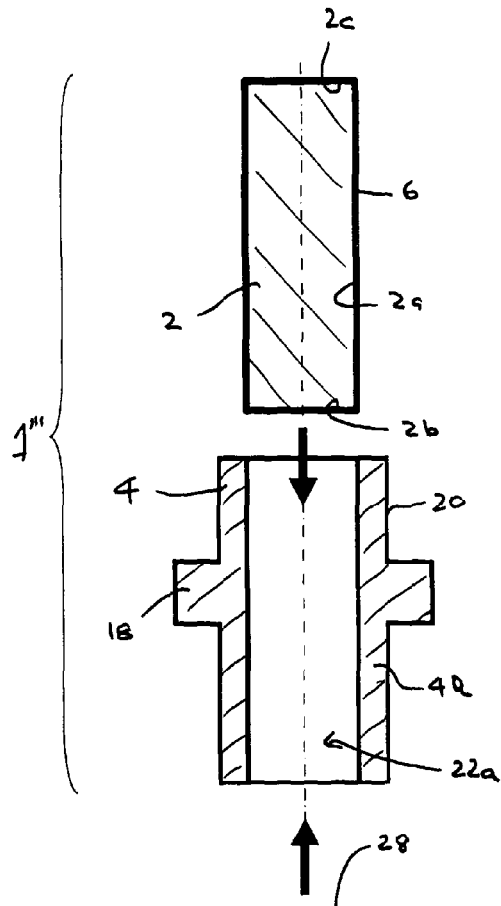
Figure 7                              Figure 8

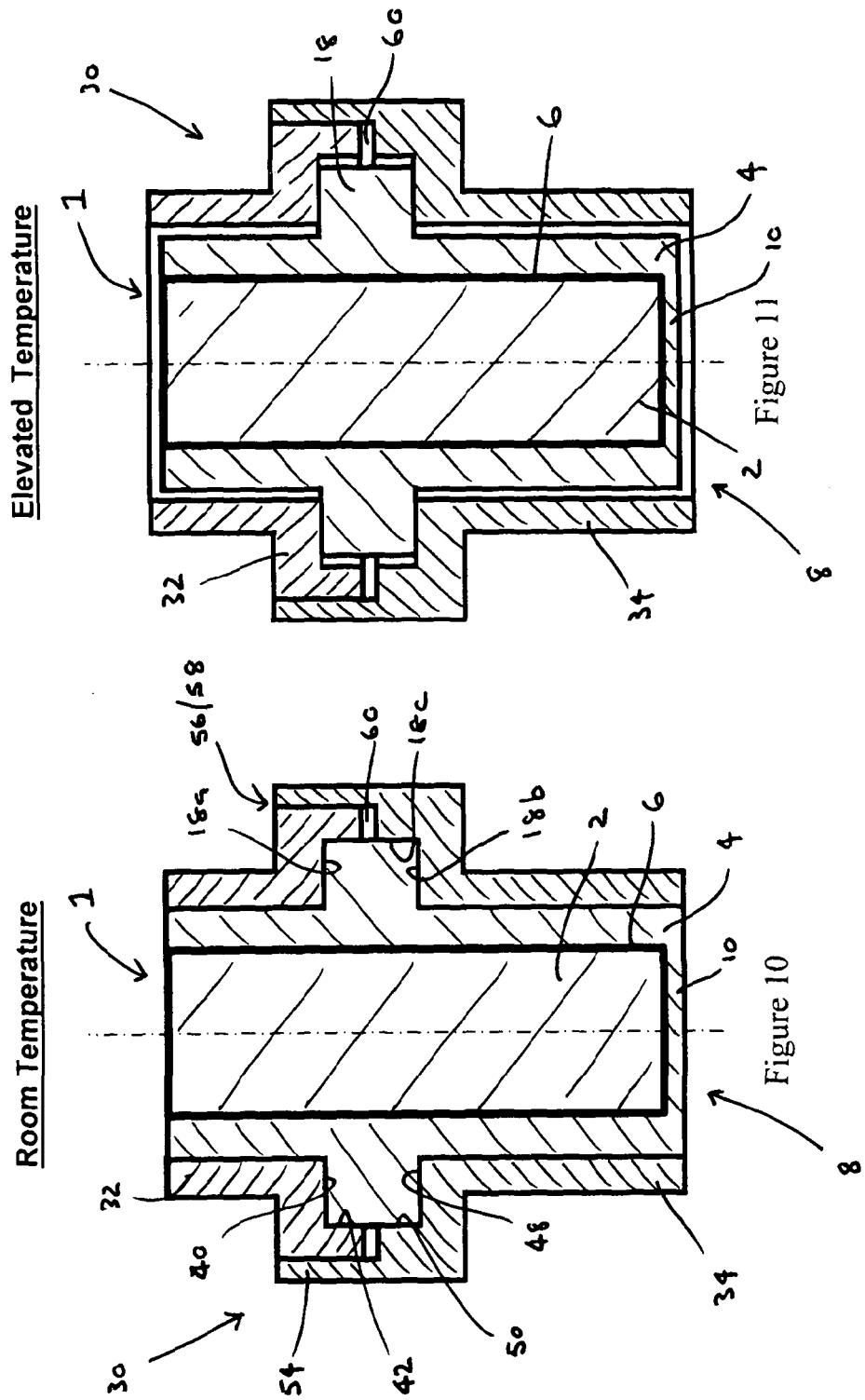

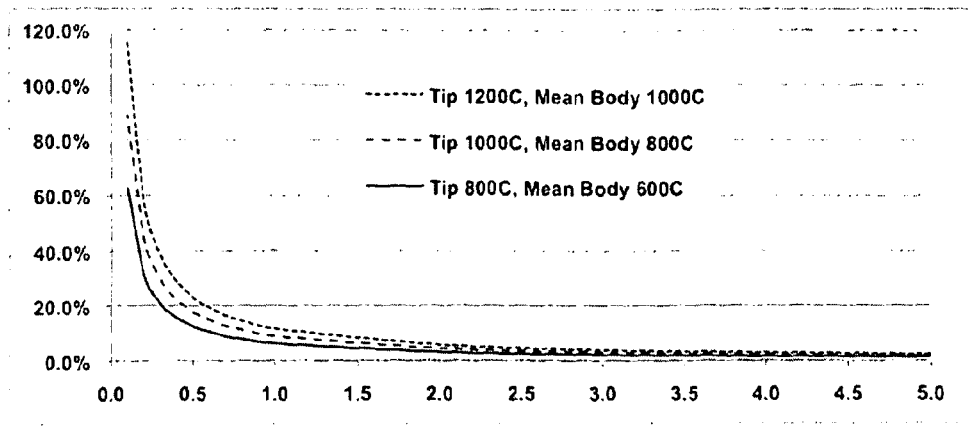
Graph (1) - Relative Expansion Error (% of Clearance)
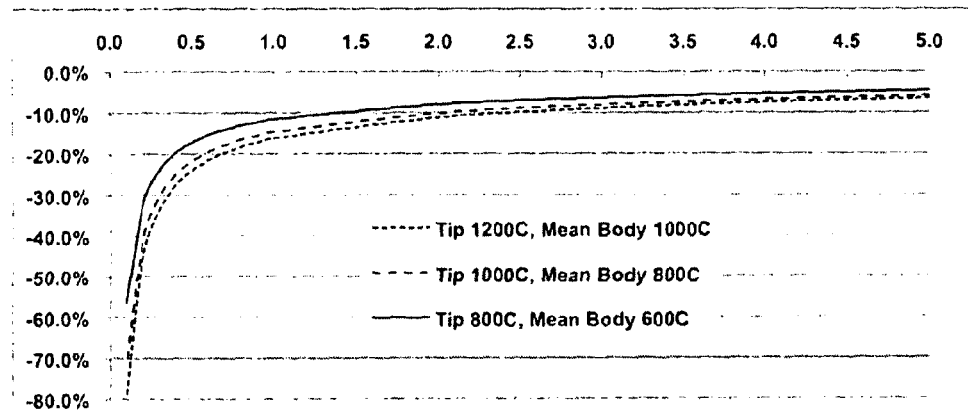
Graph (2) - Dielectric Error (% of Clearance)
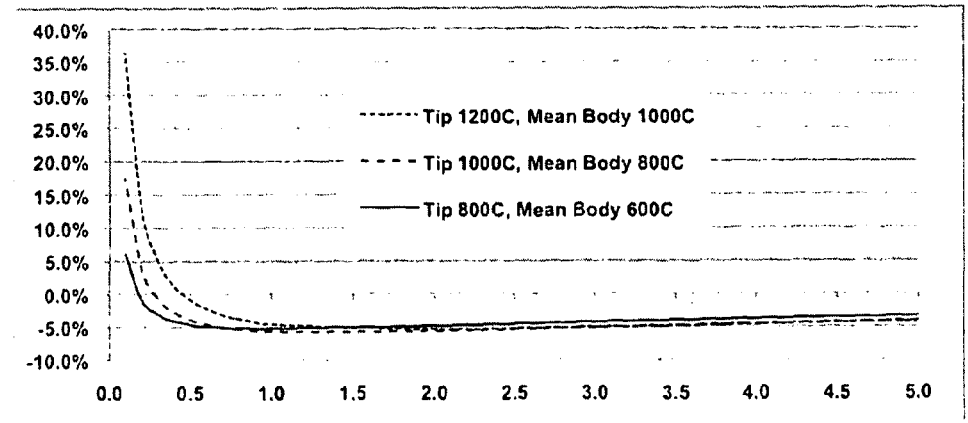
Graph (3) - Combined Error (% of Clearance)
Figure 12

SENSOR ASSEMBLIES

FIELD OF THE INVENTION

The present invention relates to sensor assemblies, and in particular to sensor assemblies that incorporate a ceramic sensor body and that can be used in high temperature operating environments.

BACKGROUND OF THE INVENTION

Known sensor assemblies typically comprise composite ceramic/metal components that are brazed together using conventional brazing process. Such a known sensor assembly might include a metal housing with a metallised aluminium oxide bush brazed into the inner diameter of the housing. A sensor body is then brazed into the internal diameter of the bush.

The sensor body can be made of one or more layers of metal, electrically conductive ceramic, electrically non-conductive ceramic that is made conductive by having a layer of conductive material (e.g. a metal) deposited on its surface, or a conductive ceramic/metal composite, for example. Conductive layers can define electrodes or other sensing elements or shield layers. Non-conductive layers can define insulating spacers that are positioned between conductive layers. The layers that form the sensor body can be machined as a preformed part and then bonded to an adjacent layer or deposited on an adjacent layer using any suitable deposition process. If the outer layer of the sensor body is made substantially from a ceramic material then its outer surface can be metallised so that the sensor body can be brazed directly into the housing using conventional brazing process without the need for the intermediate bush.

The metal housing parts of the sensor assembly might be manufactured from a low expansion alloy which is specifically designed to have a coefficient of thermal expansion substantially similar to that of the bush and/or the sensor body. If the sensor assembly is exposed to high temperatures during operation then the housing, bush and sensor body all expand at similar rates to minimise the thermal stress between the individual components.

One problem with the use of low expansion alloys is that they tend to oxidise at temperatures approaching 500° C. This places an upper limit on the operating temperature of the sensor assembly. It can be difficult to find a metal that is suitable for use at higher temperatures and which also has a thermal expansion coefficient that is substantially similar to that of the bush and/or the sensor body. A known solution is to use so-called 'active braze' process which allow certain ceramic materials to be brazed to metals without the need for metallised coatings and also provide a degree of compliance between the two different materials to accommodate the different rates of thermal expansion. In practice, however, the operating temperature of active braze alloys is limited to about 800° C. which is still not sufficiently high for certain operations. The compliant coatings that are needed to provide the degree of compliance also tend to oxidise at temperatures below 500° C. and it is normally necessary to provide a hermetic seal at the braze interface to minimise the oxidation effect.

Further problems are known to exist in situations where large relative movements occur between the component parts of the sensor assembly as a result of thermal expansion. Large relative movement can only be accommodated by increasing the thickness of the complaint coatings and this can place practical limitations on the design of the sensor assembly.

In many industrial measurement applications there is a need for a sensor assembly that can be used at high operating temperatures to measure the distance to either a stationary or passing object. A typical application is the measurement of clearance between the tip of a gas turbine engine blade and the surrounding casing. In this situation the operating temperature of the sensor assembly can reach 1500° C. Other applications including molten metal and molten glass level measurement, for example, have similar operating temperature requirements.

U.S. Pat. No. 5,760,593 (BICC plc) and U.S. Pat. No. 4,804,905 (Ding et al.) describe sensor assemblies having an electrode, optionally in the form of a metal coating or layer, that couples capacitively with the stationary or passing object. The electrode is connected to the centre conductor of a standard triaxial transmission cable and is surrounded by a metal shield and a metal outer housing. The shield and the outer housing are connected directly to the intermediate conductor and the outer conductor of the triaxial transmission cable respectively. An insulating layer is provided between the electrode and the shield and also between the shield and the outer housing. The insulating layers can be in the form of machined ceramic spacers or deposited ceramic layers, for example.

One problem with these conventional sensors is that they typically utilise an alternating combination of metal and ceramic materials. As the operating temperature of the sensor assembly increases, the metal components tend to expand more than the ceramic components. This often results in stress fractures forming in the ceramic spacers or layers, which reduce their electrical performance and may even result in the disintegration or de-lamination of the ceramic components. Not only does this cause the sensor assembly to fail electrically, but the disintegration or de-lamination of the ceramic components also allows the metal components to vibrate and this can result in the mechanical failure of the complete sensor assembly. A similar problem can occur if electrically conductive ceramics are used since just a small difference in the respective coefficients of thermal expansion (CTE) can be significant over the expected lifetime of the sensor assembly. Differential thermal expansion can also cause a reduction in measurement accuracy.

Gas turbine engine manufacturers now require an operating lifetime of at least 20,000 hours for sensors that are to be fitted to production models. Although conventional sensors have been successfully used at high operating temperatures for short periods of time, it is unlikely that they will ever be able to meet the required operating lifetime because of the inherent weakness of the sensor assembly caused by the different thermal expansion properties of the metal and ceramic (or ceramic and ceramic) components.

Conventional sensor assemblies are also susceptible to moisture penetration which can reduce the performance of the sensor.

SUMMARY OF THE INVENTION

The present invention provides a sensor body comprising: a core layer; an outer insulating layer that substantially surrounds the core layer and extends along a front part of the sensor body to define a window layer that provides a hermetic seal that excludes gas from any interface between the constituent layers of the sensor body, the core layer and the outer insulating layer being formed as separate components from the same electrically non-conducting ceramic material and bonded together to form the integral, multi-layer, sensor body; and an electrically conductive electrode layer between the core layer and the outer insulating layer, including between the core layer and the window layer.

Any suitable electrically non-conductive, preferably non-porous, ceramic material can be used, for example silicon nitride (SiN).

The front part of the sensor body, in use, will normally be the part of the sensor body that is exposed to high operating temperatures, for example.

The electrode layer is therefore set back from the front face of the sensor body and is substantially surrounded by the insulating layer (i.e. substantially embedded within the integral sensor body). The electrode layer may be exposed at a rear face of the sensor body to allow it to be connected, either directly, or indirectly by means of an intermediate electrically conductive bridge, to an inner conductor of a coaxial or triaxial transmission cable.

Providing a hermetic seal in the form of the integral window layer means that gas (e.g. air) is excluded from all internal interfaces. This can allow more flexibility in the design and materials used in the sensor body. The sensor assembly can also be exposed to high operating temperatures (e.g. up to about 1500° C.) because the constituent layers of the sensor body are not subjected to oxidation.

The window layer is preferably substantially transparent to electromagnetic radiation.

The electrode layer can be connected to the inner core of a coaxial or triaxial transmission cable that carries measurement signals to external signal processing electronics. If the sensor body is fitted within a metal outer housing as part of a sensor assembly (see below) then the outer housing can be connected to the outer conductor of a coaxial or triaxial transmission cable.

The ceramic component (or body) forming the outer insulating layer can be a single-piece component having a main part and a window part which defines the window layer of the sensor body. The window part can be the closed end of a blind bore in the component. Alternatively, the ceramic component can be a two-piece component having a main part and a separate disc part which is bonded to the main part and which defines the window layer of the sensor body. The disc part can either be located in a bore in the main part to close one end of the bore such that the outer edge surface of the disc part is bonded to a facing inner surface of the main part, or be bonded to an annular front surface of the main part. The disc part can be made from the same electrically non-conductive, preferably non-porous, ceramic as the main part and can be machined after it has been bonded to the main part.

In the case of a triaxial sensor body, an electrically conductive shield (or guard) layer can be positioned between the core layer and the outer insulating layer. The shield layer can be spaced from the electrode layer by an inner insulating layer that is formed from the same electrically non-conducting ceramic material as both the core layer and the outer insulating layer. The shield layer can be connected to the intermediate conductor of a triaxial transmission cable. The connection between the shield layer and the intermediate conductor (and also between the metal outer housing and the outer conductor) can be made directly, or indirectly by means of an intermediate electrically conductive bridge that is bonded at a rear part of the sensor body and which extends away from the sensor body towards a low temperature region.

Because the bulk constituent layers (e.g. the core layer and the insulating layer(s)) are formed from the same electrically non-conducting ceramic material, the problem of differential thermal expansion is eliminated for all practical purposes.

The electrode layer can be formed from one or more layers or coatings. The electrode layer is optionally formed from an electrically conductive ceramic material, a ceramic composite material, a metal or metal alloy, or any combination thereof, and can include a braze alloy layer in isolation, or combined with, one or more of the aforementioned materials. The electrode layer can be applied to the ceramic component that defines the core layer and/or the ceramic component that defines the outer insulating layer as a coating, optionally using a suitable deposition process.

The shield layer can be formed from one or more layers or coatings. The shield layer is optionally formed from an electrically conductive ceramic material, a ceramic composite material, a metal or metal alloy, or any combination thereof, and can include a braze alloy layer in isolation, or combined with, one or more of the aforementioned materials. The shield layer can be applied to the ceramic component that defines the inner insulating layer and/or the ceramic component that defines the outer insulating layer as a coating, optionally using a suitable deposition process. The coating can define a substantially cylindrical shield layer that is coaxial with the electrode layer and is spaced apart from it by the inner insulating layer.

In the case of a coaxial sensor body (i.e. without a shield layer), the ceramic component that defines the core layer can be pre-coated with the electrode layer and positioned within an bore in the ceramic component that defines the outer insulating layer. Alternatively, the bore in the ceramic component that defines the outer insulating layer can be pre-coated with the electrode layer before the ceramic component that defines the core layer is positioned within it. The bore will typically be a blind bore where the closed end at the front part of the ceramic body defines the window layer. More particularly, the closed end of the blind bore can be defined by the window part of the outer insulating component, which may optionally be provided as a separate, pre-formed, ceramic disc as described above that is bonded to the main part of the component. The ceramic components defining the core layer and the outer insulating layer are then bonded together using a suitable process such as sintering, diffusion bonding or brazing, for example, depending on the type of material that is used as the electrode layer.

In the case of a triaxial sensor body, the ceramic component that defines the core layer can be pre-coated with the electrode layer and positioned within a bore in a ceramic component that defines the inner insulating layer. Alternatively, the bore in the ceramic material that defines the inner insulating layer can be pre-coated with the electrode layer before the ceramic component that defines the core layer is positioned within it. The ceramic components defining the core layer and the inner insulating layer are then bonded together using a suitable process such as sintering, diffusion bonding or brazing, for example, depending on the type of material that is used as the electrode layer. The ceramic component that defines the inner insulating layer can be pre-coated with the shield layer and positioned within a bore in a ceramic component that defines the outer insulating layer. Alternatively, the bore in the ceramic material that defines the outer insulating layer can be pre-coated with the shield layer before the bonded ceramic components that define the core and inner insulating layers are positioned within it. The bore will typically be a blind bore where the closed end at the front part of the ceramic body defines the window layer. More particularly, the closed end of the blind bore will be defined by the window part of the outer insulating component, which may optionally be provided as a separate, pre-formed, ceramic disc as described above that is bonded to the main part of the component. The ceramic components defining the inner and outer insulating layers are then bonded together using a suitable process such as sintering, diffusion bonding or brazing, for example, depending on the type of material that is used as the electrode and shield layers. In an alternative process the ceramic components defining the core layer, the inner insulating layer and the outer insulating layer, pre-coated as appropriate with the electrode and shield layers, are bonded together in a single step using a suitable process such as sintering, diffusion bonding or brazing, for example.

If the outer insulating layer is formed from two separate components, e.g. a main part and disc part, then these may be bonded together to form an integral component as a pre-process, i.e. before the ceramic component that defines the core layer (coaxial sensor body) or the bonded or unbonded ceramic components that define the core and inner insulating layers (triaxial sensor body) are inserted into the bore in the outer insulating component. Alternatively, the main part and the disc part are bonded together to form an integral component as part of a main bonding process.

The various ceramic components (or bodies) used to form the coaxial and triaxial sensor bodies can be formed from un-sintered (or 'green'), partially or fully sintered ceramic material, for example.

The present invention further provides a coaxial sensor body comprising: a core layer; an outer insulating layer that substantially surrounds the core layer; and an electrically conductive electrode layer between the core layer and the outer insulating layer; wherein the core layer and the outer insulating layer are formed from the same electrically non-conducting ceramic material; and wherein the electrode layer is formed, at least in part, from titanium, an alloy of titanium or titanium nitride.

The present invention further provides a triaxial sensor body comprising: a core layer; an outer insulating layer that substantially surrounds the core layer; an electrically conductive electrode layer between the core layer and the outer insulating layer; and an electrically conductive shield (or guard) layer between the core layer and the outer insulating layer, the shield layer being spaced from the electrode layer by an inner insulating layer; wherein the core layer, the outer insulating layer and the inner insulating layer are formed from the same electrically non-conducting ceramic material; and wherein one or both of the electrode layer and the shield layer are formed, at least in part, from titanium, an alloy or titanium or titanium nitride.

For both the coaxial and triaxial sensor bodies the outer insulating layer can extend along a front part of the sensor body to define a window layer that provides a hermetic seal that excludes gas from any interface between the constituent layers of the sensor body. The electrode layer may extend between the core layer and the window layer. The core layer and the outer insulating layer (and the inner insulating layer where appropriate) can be formed as separate components and bonded together to form the integral, multi-layer, sensor body. The remaining features of the sensor bodies can be as outlined herein.

The use of titanium, a titanium alloy or titanium nitride as part of the electrode layer and/or shield layer has unexpectedly been found to provide a significant improvement in the quality of the finished sensor body.

The sensor body, or more particularly, the outer insulating layer, can include a radial flange allowing it to be fitted within an outer housing to form a sensor assembly. The housing can have an annular groove in which the radial flange of the sensor body is received, the annular groove being defined by a pair of facing shoulders each having an annular surface and a substantially cylindrical surface. The annular surfaces of the shoulders are preferably in sliding contact with annular surfaces of the flange and apply a compressive load to the flange.

The sensor body is not physically secured to the housing (e.g. by brazing) but is firmly held within the housing as a result of the compressive load that is applied to the flange by the annular surfaces of the shoulders. The particular construction of sensor assembly means that there are no significant problems with differential thermal expansion and the sensor assembly is therefore inherently suitable for high temperature operation. The sensor assembly can be manufactured in a cost-effective manner using conventional brazing process as described in more detail below.

The housing is preferably a two-part housing formed from a high temperature metal and generally as described in European Patent Application 2330408 (Future Technology (Sensors) Ltd). More particularly, one of the facing shoulders is preferably formed in a first housing part and the other of the facing shoulders is preferably formed in a second housing part. The first and second housing parts are secured together to form the two-part housing in such a way that the shoulders are in register and define the annular groove into which the radial flange of the sensor body is received. The flange is therefore normally held between the two housing parts by the applied compressive load.

The first housing part is preferably brazed to the second housing part by a braze material. Any suitable braze material can be used.

The sliding contact between the housing and the annular surfaces of the flange under the compressive load preferably provides a hermetic seal between the housing and the sensor body. The hermetic seal is maintained even when the sensor assembly is exposed to high operating temperatures.

A method of manufacturing a sensor assembly can comprise the steps of: providing a sensor body having a radial flange; locating the sensor body in a two-part housing having an annular groove in which the radial flange of the sensor body is received, the annular groove being defined by a pair of facing shoulders each having an annular surface and a substantially cylindrical surface, one shoulder being formed in a first housing part and another shoulder being formed in a second housing part; bringing the annular surfaces of the shoulders into contact with the annular surfaces of the flange; and brazing the first and second housing parts together to form an integral two-part housing by (i) raising the sensor assembly to a particular brazing temperature during which the first and second housing parts undergo thermal expansion, (ii) applying a braze material to the first and second housing parts in a molten state, and (iii) reducing the temperature of the sensor assembly so that the braze material solidifies to secure the first and second housing parts together to form the integral two-part housing and during which the first and second housing parts undergo thermal contraction to apply a compressive load to the flange.

In a preferred method the first and second housing parts are assembled together to substantially surround the sensor body with respective brazing surfaces in contact or in close proximity During the brazing process, as the sensor assembly is raised to a particular brazing temperature, the first and second housing parts are preferably loaded to maintain direct contact between the annular surfaces of the facing shoulders and the annular surfaces of the flange. More particularly, the annular surfaces of the shoulders are preferably brought into contact with the annular surfaces of the flange by applying a loading which forces the first and second housing parts towards each other in the axial direction. At the particular brazing temperature, the braze material is in the molten state and the contact between the first and second housing parts and the flange is preferably maintained under load. The brazing material is applied between the brazing surfaces of the first and second housing parts. The braze material is typically applied when the sensor assembly is at an ambient temperature (i.e. in 'cold' application process) so that it transitions to the molten state when the temperature of the sensor assembly reaches the particular brazing temperature, but the braze material can also be applied once the temperature of the sensor assembly has reached the brazing temperature (i.e. in a 'hot' application process). As the temperature of the sensor assembly is subsequently reduced, the braze material solidifies to fixedly secure the first and second housing parts together to form an integral two-part housing surrounding the sensor body, which is typically made substantially of ceramic material. The first and second housing parts undergo thermal contraction and effectively shrink onto the flange of the sensor body to apply a significant compressive load onto the flange in the axial direction. In other words, the housing contracts more than the sensor body as the temperature decreases. The application of the compressive load results in the creation of a hermetic seal between the housing and the sensor body. Providing a hermetic seal is important because it prevents moisture from penetrating the sensor assembly and reducing its operational performance.

It will be readily appreciated that the compressive load that arises from the shrinkage of the first and second housing parts is different to the external loading that is applied during the brazing process and is maintained throughout the operating lifetime of the sensor assembly. Ceramic materials are known to cope well with compressive loads and assessment shows that the risk of damage to the sensor body during the brazing process is very low. In practice the compressive load applied when the sensor assembly is at a high operating temperature will be slightly less than for ambient temperature because of the differential thermal expansion between the housing and the sensor body in the axial direction. However, the compressive load will always be at a sufficient level to maintain the hermetic seal.

When the sensor assembly is used at a high operating temperature the housing undergoes thermal expansion and expands away from the sensor body in the radial direction. In other words, the housing expands more than the sensor body as the temperature increases. The expansion causes the annular surfaces of the housing to slide relative to the annular surfaces of the flange in the radial direction and this sliding contact may be promoted by a suitable choice of material for the sensor body (or its contact surfaces) and/or the housing. Any movement of the housing relative to the sensor body in the axial direction is very small but can still be sufficient to cause measurement errors as described in more detail below.

The window layer of the sensor body provides a mechanism that allows the measurement signals provided by the sensor assembly to be self-compensating with respect to temperature. This is particularly important if the sensor assembly is to be exposed to high operating temperatures.

In a conventional sensor assembly having a metal electrode, optional metal shield, and a metal outer housing separated by ceramic insulators, the capacitance is measured between the front face of the electrode and the passing or stationary target. During sensor calibration, which is usually carried out at room temperature in air, the measured capacitance is converted by associated signal processing electronics into a voltage which is measured and stored as a function of the measured gap between the electrode and target. Typically, the larger the measured capacitance the smaller the measured gap. During operation, the dielectric constant of the air is not significantly affected by temperature changes and so the calibration at room temperature can be used to accurately determine the gap between the electrode and the target, and hence, if the sensor assembly is installed in a gas turbine engine, for example, between the tip of a gas turbine engine blade and the surrounding casing.

In a conventional sensor assembly the front face of the metal electrode, metal shield where applicable, and metal outer housing expand at substantially the same rate as the engine casing or holding fixture and so this expansion does not significantly affect the accuracy of the derived gap measurement. However, in the case of the sensor body of the present invention, the bulk constituent layers are made from ceramic material, optionally held within a two-part metal outer housing described above. The ceramic material may have a coefficient of thermal expansion (CTE) between about $3 \times 10^{-6}/° C.$ and about $4 \times 10^{-6}/° C.$ and the metal outer housing may have a CTE of about $10 \times 10^{-6}/° C.$ at room temperature and about $16 \times 10^{-6}/° C.$ at $1000°$ C. This means that the outer housing will expand more than the sensor body as the operating temperature increases, causing the front face of the sensor body to be progressively set back from the front of the outer housing, and also from the engine casing or holding fixture. The differential thermal expansion therefore causes a shift in the measured capacitance with respect to temperature which would normally result in a significant reduction in measurement accuracy. More particularly, for any constant clearance value, the differential thermal expansion of the sensor body relative to the outer housing and the engine casing causes the measured capacitance to decrease with increasing temperature and vice versa.

The window layer of the sensor body is positioned between the front face of the electrode layer and the stationary or passing object, and has a dielectric constant of about 7.8 at room temperature and about 8.8 at $1200°$ C., representing an approximate increase of about 12% over the stated temperature range. As mentioned above, the dielectric constant of the air gap is not significantly affected by temperature changes. However the measured capacitance is a combination of the dielectric air gap and the dielectric window layer and will therefore depend on the operating temperature of the sensor assembly. More particularly, for any constant clearance value, the measured capacitance increases with increasing temperature as a result of the increase in the dielectric constant of the window layer and vice versa. It will therefore be readily appreciated that, for the sensor assembly of the present invention, an increase in operating temperature results in two separate processes which affect the measured capacitance in opposite ways. In the first process, for any constant clearance value, the measured capacitance will decrease as a result of the relative thermal expansion between the metal outer housing, engine casing or holding fixture. In the second process, for any constant clearance value, the measured capacitance will increase as a result of the increase in the dielectric constant of the ceramic window layer. Since the relative thermal expansion is a function of a distance from the front face of the sensor body and the sliding seal location in the metal outer housing (i.e. the larger the distance the larger the relative thermal expansion or vice versa) then it can be seen that by controlling the thickness of the window layer as a function of this distance it is possible to substantially compensate, and in some cases fully compensate, for both the relative thermal expansion errors and dielectric errors, resulting in improved measurement accuracy over a wide operating temperature range. In practice, a window layer having a width of between about 0.5 mm and about 1.5 mm is considered to be sufficient to provide improved measurement accuracy for most sizes of sensor body.

The maximum operating temperature of the sensor assembly is effectively limited by the brazing temperature of the outer housing, taking into account the mechanical properties of the braze material and the housing material etc. It is expected that for typical brazing temperatures in excess of 1200° C. then the sensor assembly can function properly at temperatures approaching 1000° C. at the brazing surfaces. It will be readily appreciated that the temperature at other parts of the sensor assembly removed from the brazing surfaces may be significantly higher. For example, in the case of a capacitive sensor that is used to measure the clearance between the tip of a gas turbine engine blade and the surrounding casing then the front face of the sensor assembly might be exposed to temperatures of about 1500° C. with a cooler temperature being experienced at the rear of the sensor assembly where the brazing surfaces are located.

BRIEF DESCRIPTION OF THE DRAWINGS

Exemplary embodiments of the invention will now be described, with reference to the accompanying drawings, in which: Drawings

FIG. 7 is a cross section diagram showing how the third sensor body of FIG. 5 can be formed;

FIG. 8 is a cross section diagram showing how the fourth sensor body of FIG. 6 can be formed;

FIG. 10 is a cross section diagram showing the complete sensor assembly at an ambient temperature;

FIG. 11 is a cross section diagram showing the complete sensor assembly of FIG. 10 at a high operating temperature; and FIG. 12 shows how the measurement accuracy can be maintained when the sensor assembly is used at a high operating temperature.

DETAILED DESCRIPTION OF THE PREFERRED EMBODIMENTS

Figure 1:
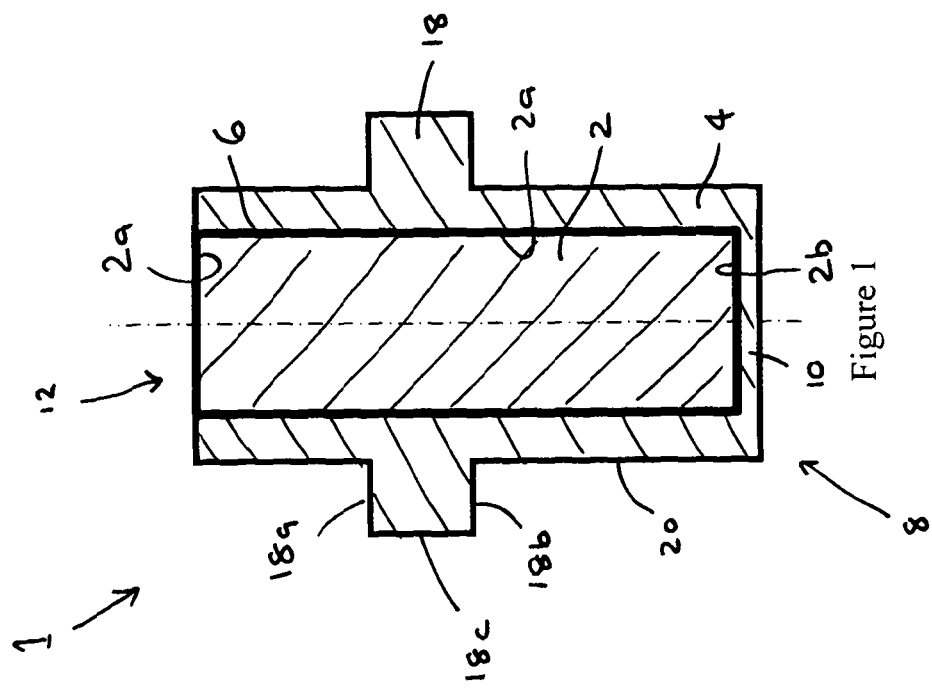
FIG. 1 is a cross section diagram showing a first sensor body according to the present invention.

FIG. 1 shows a coaxial sensor body 1 according to the present invention. The sensor body includes a core layer 2 and an outer insulating layer 4 that are made of the same electrically non-conductive ceramic material such as silicon nitride (SiN). An electrode layer 6 of metal such as titanium (Ti) or molybdenum (Mo), an alloy of titanium, or an electrically conductive ceramic such as titanium nitride (TiN) or molybdenum disilicide ($MoSi_2$) is applied as a coating and covers the cylindrical outer surface 2a, and the front and rear planar surfaces 2a, 2b of the core layer 2.

The outer insulating layer 4 extends along a front part 8 of the sensor body which in use is exposed to high operating temperatures. For example, if the sensor body forms part of a capacitive sensor that is used to measure the clearance between the tip of a gas turbine engine blade and the surrounding casing then the front part 8 of the sensor body might face towards the blade tip and be exposed to temperatures of up to about 1500° C. Along the front part 8 the outer insulating layer 4 defines a window layer 10 that is substantially transparent to electromagnetic radiation. The electrode layer 6 extends between the window layer 10 and the planar front surface 2b of the core layer 2 such that the electrode layer is substantially embedded within the front part 8 of the sensor body and is not exposed. The electrode layer 6 is exposed at a rear part 12 of the sensor body to allow it to be connected to the inner conductor of a coaxial (or triaxial) transmission cable which is not shown.

Figure 2:
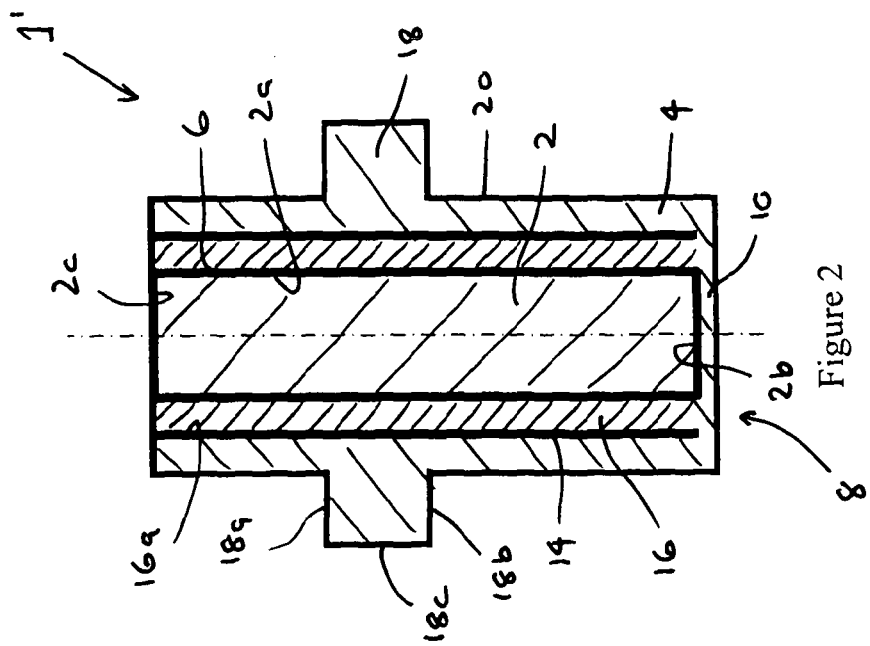
FIG. 2 is a cross section diagram showing a second sensor body according to the present invention.

FIG. 2 shows a triaxial sensor body 1' according to the present invention. The triaxial sensor body 1' is similar to the coaxial sensor body 1 shown in FIG. 1 and like parts have been given the same reference numerals. The only significant difference is that the triaxial sensor body 1' includes a cylindrical shield (or guard) layer 14 of metal such as titanium or molybdenum, an alloy of titanium, or an electrically conductive ceramic such as titanium nitride or molybdenum disilicide, that is connected to the intermediate conductor of a triaxial transmission cable which is not shown. The shield layer 14 is spaced from the electrode layer 6 by an inner insulating layer 16 and is surrounded by the outer insulating layer 4. The shield layer 14 is applied as a coating and covers the cylindrical outer surface 16a of the inner insulating layer 16.

In both cases the window layer 10, being an integral part of the outer insulating layer 4, provides a hermetic seal at the front part of the sensor body meaning that gas is excluded from all internal interfaces.

Each sensor body 1, 1' includes a flange 18 that protrudes radially outwardly from the outer cylindrical surface 20 of the outer insulating layer 4. The flange 18 includes a first annular surface 18a, a second annular surface 18b and a cylindrical surface 18c.

Figures 3, 4:
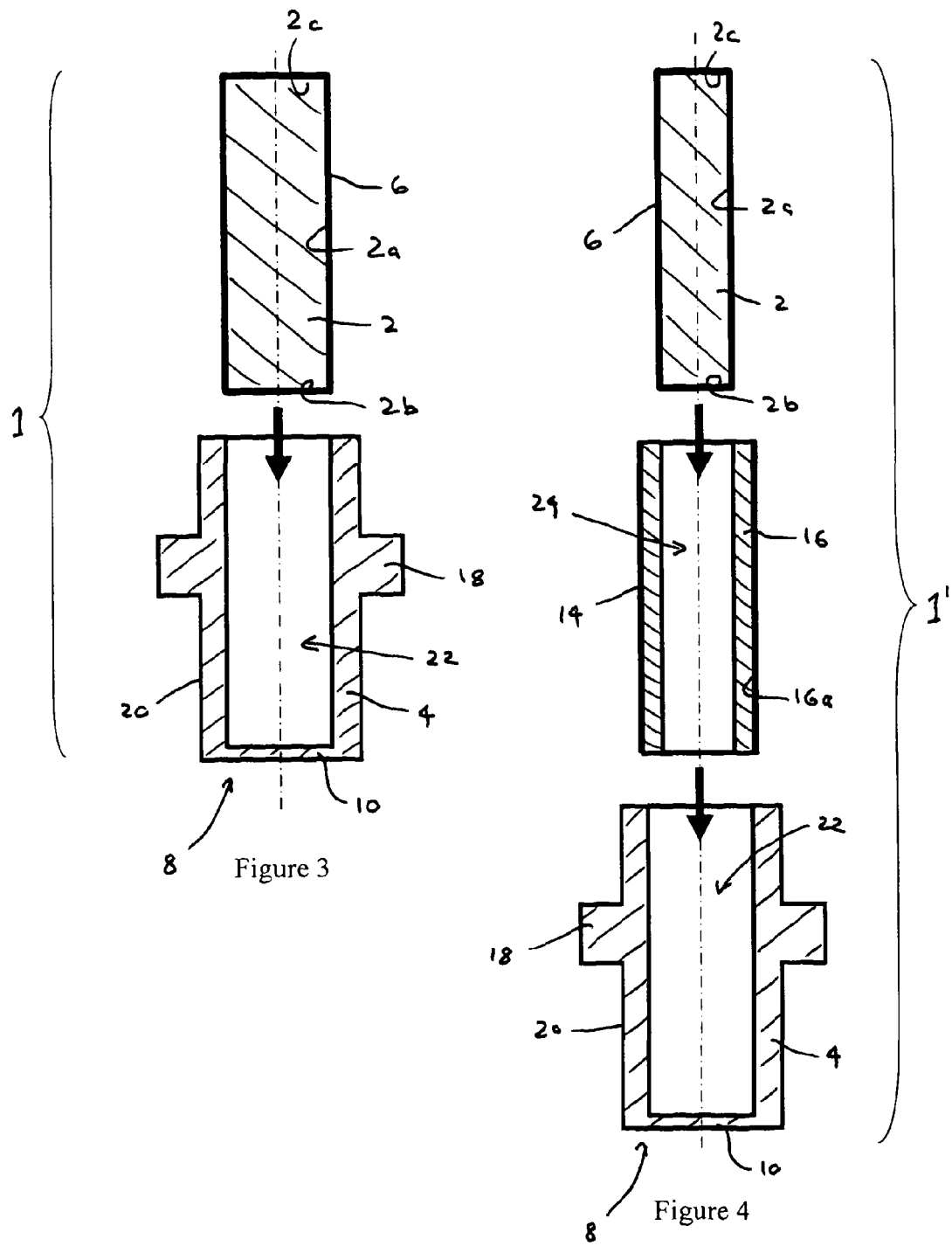
FIG. 3 is a cross section diagram showing how the first sensor body of FIG. 1 can be formed.
FIG. 4 is a cross section diagram showing how the second sensor body of FIG. 2 can be formed.

As shown in FIG. 3, the core layer 2 and the outer insulating layer 4 of the coaxial sensor body 1 are formed as separate components. The electrode layer 6 is deposited as a coating on the cylindrical outer surface 2a, and the front and rear planar surfaces 2b, 2c of the pre-formed ceramic body that defines the core layer 2. The pre-coated core body is inserted into a blind bore 22 in the pre-formed ceramic body that defines the outer insulating layer 4 such that the coated front surface 2b of the core body is in abutment with the closed end of the bore that defines the window layer 10. The pre-coated core body and the outer insulating body are then bonded together using a suitable process such as sintering, diffusion bonding or brazing, for example. Although not shown, the electrode layer can also be alternatively or additionally deposited as a coating on the cylindrical inner surface of the blind bore 22 before the ceramic body that defines the core layer 2 is inserted into it.

In the case of the triaxial sensor body 1' shown in FIG. 4, the core layer 2, the inner insulating layer 16 and the outer insulating layer 4 are formed as separate components. The electrode layer 6 is deposited as a coating on the cylindrical outer surface 2a, and the front and rear planar surfaces 2b, 2c of the pre-formed ceramic body that defines the core layer 2. The pre-coated core body is inserted into an open bore 24 in the pre-formed ceramic body that defines the inner insulating layer 16. The pre-coated core body and the inner insulating body are then bonded together using a suitable process such as sintering, diffusion bonding or brazing, for example. Although not shown, the electrode layer can also be alternatively or additionally deposited as a coating on the cylindrical inner surface of the open bore 24 before the ceramic body that defines the core layer 2 is inserted into it. The shield layer 14 is deposited as a coating on the cylindrical outer surface 16a of the inner insulating body. The pre-coated inner insulating body and the bonded core body are inserted into the blind bore 22 of the pre-formed ceramic body that defines the outer insulating layer 4 such that the coated front surface 2b of the core body is in abutment with the closed end of the bore that defines the window layer 10. The pre-coated inner insulating body and the outer insulating body are then bonded together using a suitable process such as sintering, diffusion bonding or brazing, for example. Although not shown, the shield layer can also be alternatively or additionally deposited as a coating on the cylindrical inner surface of the blind bore 22. In an alternative process the various ceramic bodies are coated as appropriate and then bonded together in a single step using a suitable process such as sintering, diffusion bonding or brazing, for example.

Figure 6:
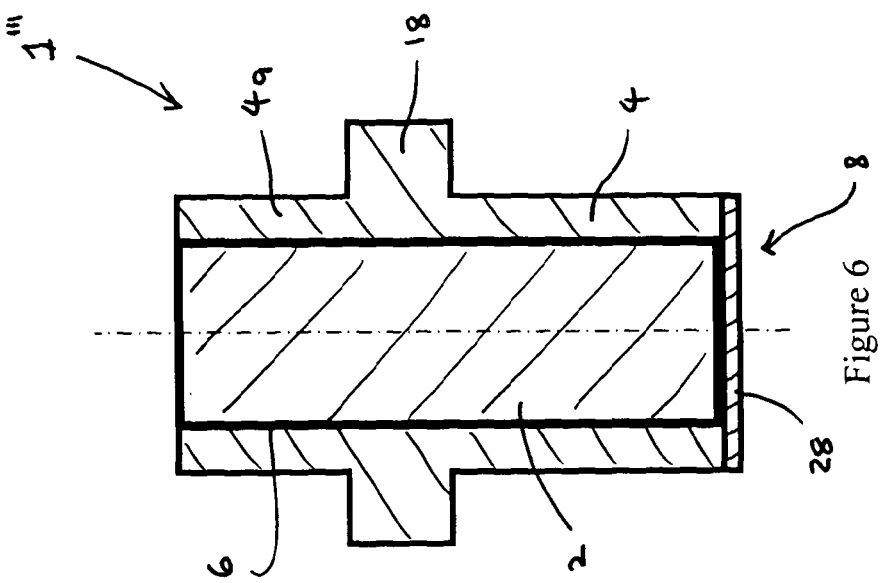
FIG. 6 is a cross section diagram showing a fourth sensor body according to the present invention.
Figure 5:
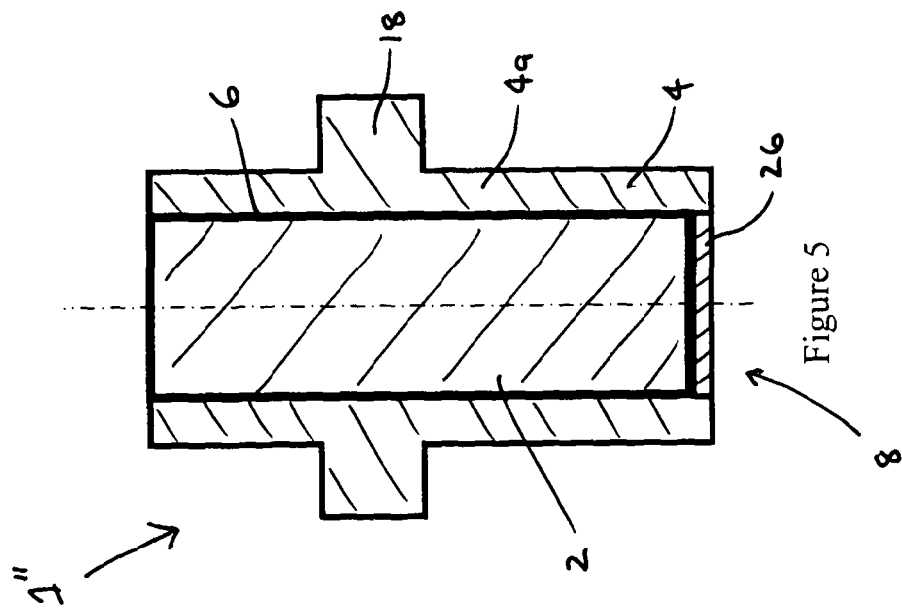
FIG. 5 is a cross section diagram showing a third sensor body according to the present invention.

FIG. 5 shows an alternative coaxial sensor body 1″ according to the present invention. The coaxial sensor body 1″ is similar to the coaxial sensor body 1 shown in FIG. 1 and like parts have been given the same reference numerals. The only significant difference is that the ceramic body that defines the outer insulating layer 4 is of two-part construction with a main part 4a that includes an open bore 22a and a ceramic disc part 26 which is bonded to the main part 4a to define the window layer 10. A yet further alternative coaxial sensor body 1‴ according to the present invention is shown in FIG. 6 and also includes a ceramic disc part 28. Alternative triaxial sensors (not shown) can also use a ceramic disc part.

FIGS. 7 and 8 show how the ceramic disc parts 26, 28 can be used to close the open bore 22a. In FIG. 7 the disc 26 is positioned within the front end of the bore 22a such that its outer edge is in contact with an inner surface of the bore. In FIG. 8 the disc 28 is positioned to close the front end of the bore 22a with its planar rear surface in contact with the annular surface of the main part 4a of the ceramic body. Each disc part 26, 28 is bonded to the main part 4a using a suitable process such as sintering, diffusion bonding or brazing, for example, to produce an integral ceramic body into which the pre-coated ceramic body that defines the core layer 2 can be received. In an alternative process, the pre-coated ceramic body that defines the core layer 2 and the main part 4a and disc part 26, 28 of the outer insulating ceramic body are bonded together in a single step using a suitable process such as sintering, diffusion bonding or brazing, for example. Alternative triaxial sensors (not shown) can be formed in a similar way.

Each finished sensor body has an integral, multi-layer, construction.

Figure 9:
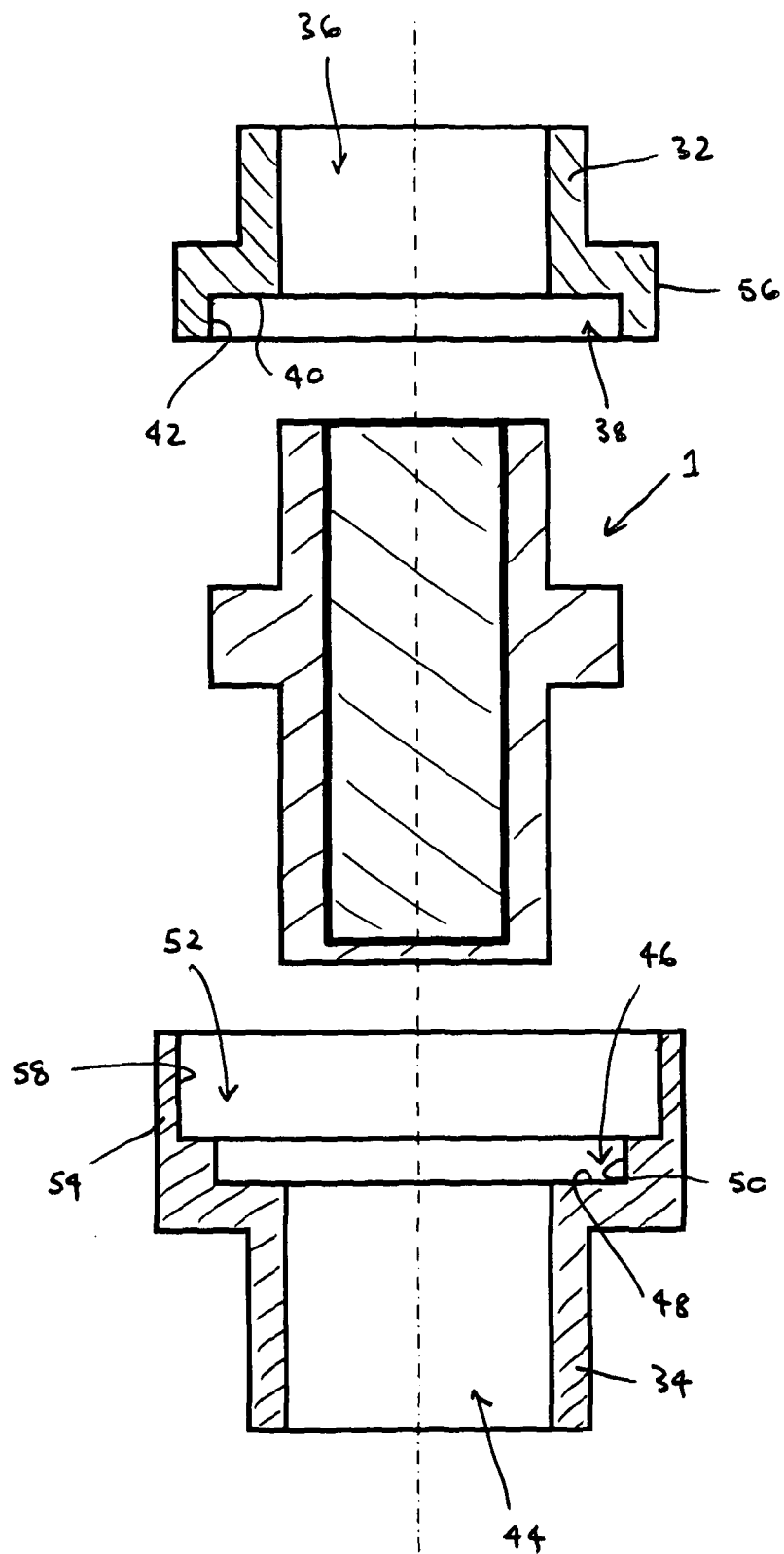
FIG. 9 is an exploded cross section diagram showing a sensor assembly where the sensor body of FIG. 1 is installed into a two-part outer housing.

With reference to FIGS. 9 and 10, a metal outer housing 30 is made up of a first housing part 32 and a second housing part 34. The housing 30 can be grounded by being connected to the outer conductor of a coaxial or triaxial transmission cable which is not shown.

The first housing part 32 includes a central cylindrical bore 36 and an annular shoulder 38 having a larger diameter than the central bore and which is defined by an annular surface 40 and a cylindrical surface 42.

The second housing part 34 includes a central cylindrical bore 44 and an annular shoulder 46 having a larger diameter than the central bore and which is defined by an annular surface 48 and a cylindrical surface 50. An outer bore 52 has a larger diameter than the cylindrical surface 50 and is defined by an axially extending flange 54 of the second housing part.

The central bores 36, 44 in each housing part are sized to receive the sensor body 1 (or any of the other sensor bodies described above) with a close tolerance fit to the outer surface 20 when the sensor assembly is at an ambient temperature. However, the radial fit between the outer surface of the sensor body flange and the inner surface of the housing is generally not considered to be critical.

The first housing part 32 includes a cylindrical brazing surface 56. When the first housing part 32 is assembled to the second housing part 44 as shown in FIG. 6 then the brazing surface 56 faces a corresponding cylindrical brazing surface 58 of the flange 54. More particularly, when assembled together, the brazing surface 56 of the first housing part 32 is located radially within the flange 54 of the second housing part 44 with a close tolerance fit. The annular shoulders 38, 46 are also aligned to define an annular groove or recess into which the flange 18 of the sensor body is received with a close tolerance fit when the sensor assembly is at an ambient temperature. Although not shown, the upper surfaces of the first and second housing parts 32, 34 may be chamfered adjacent the respective brazing surface so that when they are assembled together they define a narrow annular groove into which the brazing material can be deposited.

The sensor assembly can be assembled as follows:

The second housing part 34 is supported in a suitable frame or support. The sensor body 1 is inserted into the central cylindrical bore 44 of the second housing part 34 and the first housing part 32 is then located to the second housing part 34 with the upper part of the sensor body positioned in the central cylindrical bore 36 and the respective brazing surfaces 56, 58 axially aligned.

The first and second housing parts 32, 34 are then secured together by a brazing process. A brazing material (optionally in the form of a paste) is applied to the upper surface of the sensor assembly at the interface between the respective brazing surfaces 56, 58 of the first and second housing parts 32, 34. The brazing material may sit in the narrow annular groove (not shown) mentioned above. The sensor assembly is raised to a particular brazing temperature that is determined by the brazing material that it to be used. During the brazing process, an axial loading is applied to the first housing part 32 to maintain a direct contact between the annular surfaces 40, 48 of the facing shoulders and the annular surfaces 18a, 18b of the flange 18.

As the temperature of the sensor assembly is raised to the brazing temperature, the first and second housing parts 32, 34 expand away from the sensor body in the radial direction and axial directions. Direct contact between the annular surfaces 40, 48 of the facing shoulders and the annular surfaces 18a, 18b of the flange 18 is maintained by the axial loading. The axial gap 60 ensures that there is no direct contact between the first and second housing parts 32, 34 that would otherwise limit or restrict the amount of axial loading that can be applied to the flange 18. In other words, the axial compression force acting on the annular surfaces 18a, 18b of the flange 18 is determined solely by the axial loading applied during the brazing process and the subsequent compressive load.

Once the temperature of the sensor assembly reaches the brazing temperature, the braze material is in the molten state and is drawn down into the interface between the brazing surfaces 56, 58 of the first and second housing parts 32, 34 by capillary action.

As the temperature of the sensor assembly is subsequently reduced, the braze material solidifies to secure the first and second housing parts 32, 34 together to form an integral two-part housing 30 surrounding the sensor body. More particularly, the first and second housing parts 32, 34 are fixedly secured together by the brazing material at the join or interface between the facing brazing surfaces 56, 58. The first and second housing parts 32, 34 are not secured together at any other interface and are not secured in any way to the sensor body. The absence of fixing between the housing 30 and the sensor body means that the sensor assembly does not experience any stresses as a result of differential thermal expansion which might in other circumstances lead to the disintegration or failure of the ceramic and/or metal components.

The first and second housing parts 32, 34 undergo thermal contraction and effectively shrink onto the flange 18 of the sensor body to apply a significant compressive load onto the flange in the axial direction. The application of the compressive load during the brazing process results in the creation of a hermetic seal between the housing 30 and the sensor body. More particularly, the hermetic seal is formed between the annular surfaces 40, 48 of the facing shoulders and the annular surfaces 18a, 18b of the flange 18. One or more of the annular surfaces may be machined, coated or otherwise treated to provide a smooth surface finish so that close physical contact is established across as large an area as possible.

When the sensor assembly is used at a high operating temperature the first and second housing parts 32, 34 undergo thermal expansion and expand away from the sensor body in the radial and axial directions as shown in FIG. 11. The expansion in the radial direction causes the annular surfaces 40, 48 of the housing to slide relative to the annular surfaces 18a, 18b of the flange 18 in the radial direction. However, the flange 18 of the sensor body remains under a compressive load at the high operating temperature and the hermetic seal is maintained at all times during the operational lifetime of the sensor assembly. Because the outer housing 30 expands more than the sensor body in the axial direction as the operating temperature increases, the front face of the sensor body is progressively set back from the front of the outer housing, and also from the engine casing or holding fixture. The rear face of the sensor body is progressively set back in a similar way. For any constant clearance value, the differential thermal expansion of the sensor body 1 relative to the outer housing 30 causes the measured capacitance to decrease with increasing temperature and vice versa.

The thickness of the flange 18 in the axial direction is preferably kept to a minimum in order to minimise the differential thermal expansion between the flange and the first and second housing parts 32, 34. It will be readily appreciated that if the differential thermal expansion is too large then this might result in the hermetic seal being compromised. However, the flange 18 must also be thick enough to cope with the external loading that is applied during the brazing process and the resulting compression load. The flange 18 also preferably protrudes beyond the outer surface of the sensor body by an amount that will allow radial expansion of the first and second housing parts 32, 34 away from the sensor body while keeping sufficient contact between the respective annular surfaces to maintain the hermetic seal.

FIG. 12 shows how the window layer 10 of the sensor body provides a mechanism that allows the measurement signals provided by the sensor assembly to be self-compensating with increasing operating temperature. The graphs assume that the widow layer is 0.5 mm thick and that the gauge length (i.e. the distance between the front face of the sensor body and the front sliding seal face) is 8.5 mm. In each graph the error in the measured capacitance (y-axis) is expressed as a percentage of the measured clearance (x-axis) between the engine casing and the blade tip with the front face of the sensor body flush with the engine casing. Each graph includes results for different operating temperatures, namely: (i) where the front face (or tip) of the sensor body is at 800° C. and the mean sensor body temperature is 600° C., (ii) where the front face of the sensor body is at 1000° C. and the mean sensor body temperature is 800° C., and (iii) where the front face of the sensor body is at 1200° C. and the mean sensor body temperature is 1000° C. Graph (1) shows the error that arises from the differential thermal expansion. Graph (2) shows the error that arises from the change in the dielectric constant of the ceramic window layer. Graph (3) shows the overall error as the result of the two separate processes mentioned above.

It will be readily appreciated that the error increases significantly for clearance values less than 0.5 mm. However, in practice, the front face (or tip) of the sensor body is typically set back from the engine casing by around 0.5 mm to avoid damage due to blade tip rubs on the casing and so the measurement errors are in a very close band up to this point. For this particular sensor configuration, the error in measured capacitance is substantially constant at around −5% in the 1.0 to 5.0 mm clearance range and so in practice a positive 5% offset could be applied to all measurements in this same range to compensate for the measurement errors.

What is claimed is:

1. A sensor body comprising:
a core layer;
an outer insulating layer that substantially surrounds the core layer and extends along a front part of the sensor body to define a window layer that provides a hermetic seal that excludes gas from any interface between constituent layers of the sensor body, the core layer being pre-formed as a separate component from an electrically non-conductive ceramic material, and the outer insulating layer being pre-formed as a separate component from the same electrically non-conductive ceramic material, the core-layer and the outer insulating layer being bonded together to form an integral, multi-layer, sensor body; and
an electrically conductive electrode layer between the core layer and the outer insulating layer, including between the core layer and the window layer.

2. The sensor body according to claim 1, wherein the component forming the outer insulating layer is a single-piece component having a main part and a window part that defines the window layer of the sensor body.

3. The sensor body according to claim 1, wherein the component forming the outer insulating layer is a two-piece component having a main part and a separate disc part that is bonded to the main part and that defines the window layer of the sensor body.

4. The sensor body according to claim 1, wherein the ceramic material is non-porous.

5. The sensor body according to claim 1, wherein the window layer is substantially transparent to electromagnetic radiation.

6. The sensor body according to claim 1, wherein the electrode layer is formed from titanium, a titanium alloy, or titanium nitride.

7. The sensor body according to claim 1, wherein the electrode layer includes a braze alloy layer in isolation, or combined with, a layer formed from an electrically conductive ceramic material, a ceramic composite material, a metal or metal alloy, or any combination thereof.

8. The sensor body according to claim 1, wherein an electrically conductive shield layer is positioned between the core layer and the outer insulating layer.

9. The sensor body according to claim 8, wherein the shield layer is spaced from the electrode layer by an inner insulating layer and the inner insulating layer is pre-formed as a separate component from the same electrically non-conductive ceramic material, the inner insulating layer being bonded together with the core layer and the outer insulating layer to form the sensor body.

10. The sensor body according to claim 8, wherein the shield layer is formed from titanium, a titanium alloy, or a titanium nitride.

11. The sensor body according to claim 8, wherein the shield layer includes a braze alloy layer in isolation, or combined with, a layer formed from an electrically conductive ceramic material, a ceramic composite material, a metal or metal alloy, or any combination thereof.

12. The sensor body according to claim 1, further comprising a radial flange.

13. A sensor assembly comprising:
   (a) a sensor body including:
      a core layer;
      an outer insulating layer that substantially surrounds the core layer and extends along a front part of the sensor body to define a window layer that provides a hermetic seal that excludes gas from any interface between constituent layers of the sensor body, the core layer being pre-formed as a separate component from an electrically non-conductive ceramic material, and the outer insulating layer being pre-formed as a separate component from the same electrically non-conductive ceramic material, the core layer and the outer insulating layer being bonded together to form an integral, multi-layer, sensor body;
      an electrically conductive electrode layer between the core layer and the outer insulating layer, including between the core layer and the window layer; and
      a radial flange that protrudes radially outwardly from the outer insulating layer and comprises first and second annular surfaces; and
   (b) a housing having an annular groove in which the radial flange of the sensor body is received, the annular groove being defined by a pair of facing shoulders each having an annular surface and a substantially cylindrical surface;
   wherein the annular surfaces of the shoulders are in sliding contact with the first and second annular surfaces of the flange and apply a compressive load to the flange.

14. A method of making a coaxial sensor body comprising the steps of:
   providing a core component being pre-formed as a separate component from an electrically non-conductive ceramic material;
   providing an outer insulating component having a bore, the outer insulating component being pre-formed as a separate component from the same electrically non-conductive ceramic material;
   applying an electrically conductive electrode layer as a coating to the core component and/or to the bore of the outer insulating component;
   positioning the core component in the bore; and
   bonding the core component and the outer insulating component together to form an integral, multi-layer, sensor body comprising a core layer, an outer insulating layer that substantially surrounds the core layer and extends along a front part of the sensor body to define a window layer that provides a hermetic seal that excludes gas from any interface between constituent layers of the sensor body, and an electrically conductive electrode layer between the core layer and the outer insulating layer, including between the core layer and the window layer.

15. The method according to claim 14, wherein the outer insulating component is (a) a single-piece component having a main part and a window part that defines the window layer of the sensor body, the window part being formed by the closed end of a blind bore in which the core component is positioned, or (b) a two-piece component having a main part and a separate disc part that is bonded to the main part to close an end of an open bore in which the core component is positioned and that defines the window layer of the sensor body.

16. A method of making a triaxial sensor body comprising the steps of:
   providing a core component;
   providing an inner insulating component having an outer surface and a bore;
   providing an outer insulating component having a bore, wherein the core component, the inner insulating component, and the outer insulating component are all formed from the same electrically non-conductive ceramic material;
   applying an electrically conductive electrode layer as a coating to the core component and/or the bore of the inner insulating component;
   positioning the core component in the bore of the inner insulating component;
   applying an electrically conductive shield layer as a coating to the outer surface of the inner insulating component and/or to the bore of the outer insulating component;
   positioning the core component and the inner insulating component in the bore of the outer insulating component; and
   bonding the core component, the inner insulating component, and the outer insulating component together to form an integral, multi-layer, sensor body comprising a core layer, an outer insulating layer that substantially surrounds the core layer and extends along a front part of the sensor body to define a window layer that provides a hermetic seal that excludes gas from any interface between constituent layers of the sensor body, an electrically conductive electrode layer between the core layer and the outer insulating layer and between the core layer and the window layer, and an electrically conductive shield layer positioned between the core layer and the outer insulating layer and spaced from the electrode layer by an inner insulating layer.

17. The method according to claim 16, wherein the outer insulating component is (a) a single-piece component having a main part and a window part that defines the window layer of the sensor body, the window part being formed by the closed end of a blind bore in which the core and the inner insulating components are positioned, or (b) a two-piece component having a main part and a separate disc part that is bonded to the main part to close an end of an open bore in which the core and inner insulating components are positioned and that defines the window layer of the sensor body.

18. The method according to claim 16, wherein the core and inner insulating components are bonded together before being positioned in the bore of the outer insulating component.

* * * * *